United States Patent
Tralshawala et al.

(10) Patent No.: US 7,365,534 B2
(45) Date of Patent: Apr. 29, 2008

(54) APPARATUS FOR MEASURING MAGNETIC FIELDS USING A SUPERCONDUCTING QUANTUM INTERFERENCE DEVICE

(75) Inventors: Nilesh Tralshawala, Clifton Park, NY (US); Alexander Bakharev, Niskayuna, NY (US); Yuri Polyako, East Setauket, NY (US)

(73) Assignee: CardioMag Imaging, Inc., Schenectady, NY (US)

( * ) Notice: Subject to any disclaimer, the term of this patent is extended or adjusted under 35 U.S.C. 154(b) by 23 days.

(21) Appl. No.: 10/500,950

(22) PCT Filed: Feb. 26, 2003

(86) PCT No.: PCT/US03/05752

§ 371 (c)(1),
(2), (4) Date: Jul. 7, 2004

(87) PCT Pub. No.: WO03/073117

PCT Pub. Date: Sep. 4, 2003

(65) Prior Publication Data

US 2004/0239319 A1    Dec. 2, 2004

Related U.S. Application Data

(60) Provisional application No. 60/360,090, filed on Feb. 26, 2002.

(51) Int. Cl.
*G01R 33/035* (2006.01)
(52) U.S. Cl. .................................. 324/248; 505/846
(58) Field of Classification Search ................ 324/248, 324/244, 260, 262; 505/842–846; 327/527
See application file for complete search history.

(56) References Cited

U.S. PATENT DOCUMENTS 4,324,255 A    4/1982    Barach et al.

(Continued)

FOREIGN PATENT DOCUMENTS

JP    4-160380    6/1992

(Continued)

OTHER PUBLICATIONS

N. Ishikawa et al. "Effect of RF Interference on Characteristics of DC Squid System" IEEE Transactions on Applied Superconductivity, vol. 3 No. 1, Mar. 1993, pp. 1910-1913.

(Continued)

*Primary Examiner*—Jay M Patidar
(74) *Attorney, Agent, or Firm*—Katten Muchin Rosenman LLP

(57) ABSTRACT

An instrument for measuring sub-pico Tesla magnetic fields using a superconducting quantum interference device (SQUID) inductively coupled to an unshielded gradiometer includes a filter for filtering magnetically-and electrically coupled radio frequency interference (RFI) away from the SQUID. This RFI is principally coupled to the SQUID via the unshielded gradiometer. The filter circuit includes a resistor-capacitor (RC) combination interconnected to first and second terminals so that it is parallel to both an input coil of the SQUID and the gradiometer. In addition, a shielding enclosure is used to electromagnetically shield the filter circuit from the SQUID, and a method is employed to increase the impedance between the input coil and the SQUID without diminishing the overall sensitivity of the instrument.

9 Claims, 12 Drawing Sheets

U.S. PATENT DOCUMENTS

| | | | |
|---|---|---|---|
| 5,319,307 | A | 6/1994 | Simmonds |
| 5,532,592 | A | 7/1996 | Colclough |
| 6,066,948 | A | 5/2000 | Seppa |
| 6,169,397 | B1 | 1/2001 | Steinbach et al. |
| 6,448,767 | B1 | 9/2002 | Ganther, Jr. et al. |

FOREIGN PATENT DOCUMENTS

| | | |
|---|---|---|
| JP | 4-212079 | 8/1992 |
| JP | 7-198815 | 8/1995 |
| JP | 7198815 | 8/1995 |

OTHER PUBLICATIONS

R.H. Koch "Effects of radio frequency radiation on the dc SQUID" Appl. Phys. Lett. 65 (1), Jul. 4, 1994, pp. 100-102.

M. Bick et al. "SQUID gradiometry for magnetocardiography using different noisecancellation techniques" IEEE Transactions on Applied Superconductivity, vol. 11 No. 1, Mar. 2001, pp. 673-676.

M. Tarasov et al. "Optimization of Input Impedance and Mechanism of Noise Suppression in a DC Squid RF Amplifier" IEEE Transactions on Applied Superconductivity, vol. 6 No. 2, Jun. 1996, pp. 81-86.

APPARATUS FOR MEASURING MAGNETIC FIELDS USING A SUPERCONDUCTING QUANTUM INTERFERENCE DEVICE

CROSS-REFERENCE TO RELATED APPLICATION

This application is the National Stage of International Application No. PCT/US03/05752, filed Feb. 26, 2003, which claims the benefit under 35 U.S.C. 119(e) of U.S. Provisional Application No. 60/360,090, filed Feb. 26, 2002.

BACKGROUND OF THE INVENTION

1. Field of the Invention

The present invention relates generally to the field of measuring magnetic fields. More specifically, the present invention relates to measuring low-level magnetic fields with gradiometers and magnetometers using superconducting quantum interference devices (SQUIDs) in unshielded environments.

2. Discussion of the Prior Art

A superconducting quantum interference device (SQUID) magnetic sensor is at the heart of many sensitive magnetometers aimed at measuring magnetic fields below about $10^{-12}$ Tesla (T). This level is within the range, for example, of magnetic fields produced by living organisms (often referred to as biomagnetic fields).

SQUIDs are sensitive to magnetic flux $\Phi_B$. Magnetic flux $\Phi_B$ may be defined as the projection of the average magnetic field threading a given area along a vector z positioned normally to the area, or mathematically:

$$\Phi_B = B_z * A \qquad (1)$$

A low-Tesla direct current (DC) SQUID typically consists of two nominally identical Josephson junctions serially connected in a superconducting, electrically continuous loop, typically on the order of $10^{-4}$ to $10^{-2}$ millimeters (mm) in diameter. SQUID-based magnetometers and gradiometers are among the most sensitive magnetic field detectors in current use.

SQUIDs are typically produced on chips, using Niobium-Aluminum-Aluminum Oxide-Niobium (Nb—Al—AlO$_x$—Nb) junction technology, with associated junctions and the SQUID loop formed from thin films. The micron-scale features of the device may be formed using photolithographic techniques. The SQUID chip is typically enclosed in a superconducting shield for screening the device from ambient magnetic flux. The magnetic flux to be measured is typically intercepted by considerably larger diameter loops or coils (for example, 10-20 mm) inductively coupled to the SQUID via an input coil. These larger coils are usually made of thin insulated superconducting wire (for example, Nb) wound over an insulating cylindrical support. A device having a single coil or loop may be referred to as a magnetometer, a device having combinations of more than one coil or loop may be referred to as a gradiometer. Such a device is schematically illustrated, for example, in FIG. 4.

Unfortunately, this unprecedented sensitivity of SQUID-based gradiometers comes at a price, as sensitivity can cause the device to become overwhelmed by ambient noise and to stop working when exposed to radio frequency interference (RFI). As a result, these devices can often only be operated in heavily shielded enclosures, which may be impractical for all real life applications. Accordingly, it would be quite beneficial if SQUID-based devices could be operated without such shielding. If we can do this then we have a practical sensitive magnetic field measuring instrument. The present application discloses a method and apparatus for achieving this goal.

In the presence of RFI, a SQUID may lose sensitivity or even cease to function. Sources of strong RFI include, for example, ultrasound machines in hospitals, AM and FM radio signals, TV and cellular communications transmissions. At frequencies lower than the RF band, SQUID electronics can be used to measure the noise, and known software techniques can be used to eliminate this noise (e.g., Bick et al., "SQUID Gradiometry for Magnetocardiography Using Different Noise Cancellation Techniques").

A simple but often impractical solution to RFI elimination in prior art systems has been to surround the system with a few layers of fine copper mesh and isolate the area of operation. The copper mesh reduces RFI considerably, but doesn't eliminate it, as it is difficult to cut down transmission through connecting cables. While the SQUID itself may be suitably shielded inside a small Nb tube, an unshielded gradiometer that picks up the measurement signal and feeds it to the SQUID will nonetheless couple RFI into the SQUID, as the gradiometer itself cannot be shielded (otherwise it cannot pick up the signal to be measured). Thus, there is a need for a technique that allows the gradiometer to couple the signal of interest into the SQUID, without additionally coupling the RFI into the SQUID.

The following references provide for a general description of prior art SQUID systems, but they fail to provide effective means for shielding the SQUID from radio frequency interference.

The Japanese patent to Fujimaki (JP 4212079) provides for a SQUID magnetic field sensor, wherein damping resistors R1 and R2 are used to eliminate only the magnetic part of the RFI.

The non-patent literature to Ishikawa et al. entitled, "Effect of RF Interference on Characteristics of a DC SQUID System", and Koch et al (Appl. Phys. Lett., vol 65, pp. 100-102) entitled, "Effects of radio frequency radiation on the dc SQUID," provide background information related to RFI interference in SQUID systems.

The non-patent literature to Bick et al. ("SQUID Gradiometry for Magnetocardiography Using Different Noise Cancellation Techniques"), and Tarasov et al. ("Optimization of Input Impedance and Mechanism of Noise Suppression in a DC SQUID RF Amplifier") illustrate, in general, the use of noise cancellation techniques with a SQUID device.

The U.S. patent to Simmonds (U.S. Pat. No. 5,319,307) covers improving SQUID performance. References to a superconducting shielding layer are directed to shielding the SQUID chip from RFI, and it should be noted that in general all SQUIDs, even those used in shielded enclosures, are kept inside a superconducting Nb tube with gradiometers connected from the outside through small holes in the Nb tube.

The U.S. patent to Colclough (U.S. Pat. No. 5,532,592) covers electronics (flux-locked loops) in multichannel systems. It should be noted that the reference to a brass enclosure is a routine procedure in electronics to shield against RFI; but this procedure is inadequate against RFI transmitted through a wire that goes through enclosures.

The U.S. patent to Seppä (U.S. Pat. No. 6,066,948) discloses damping individual junctions of a SQUID. It should be noted that this is a common procedure and more information regarding this procedure can be found in the book by Weinstock entitled, "Applications of Superconductivity" (Kluwer, Netherlands, 2000). It should further be noted that this procedure allows for the damping of internal oscillations of junctions that affect operation of the SQUIDs and does not reduce RFI coupled to the SQUID itself.

The U.S. patent to Steinbach et al. (U.S. Pat. No. 6,169,397) describes a method for damping internal resonances of the SQUID. The damping helps shield the SQUID from magnetic part of the RFI and is similar to the Japanese patent by Goto (JP 4160380) that provides for a general background in noise suppression techniques as implemented in prior art SQUID systems.

Furthermore, the Japanese patent to Kawai (JP 7198815) appears to teach along the same lines as that of the Steinbach et al. patent.

SUMMARY OF THE INVENTION

The present invention provides an apparatus and method for preventing RFI from coupling into a SQUID without compromising the signal to noise ratio of the system, and while operating the system in unshielded real life situations.

In the preferred embodiment, filter circuits are incorporated in a novel manner to remove RFI from the SQUID without shielding gradiometer loops. The filter circuits are formed using a combination of resistors and capacitors (RC circuits), where the resistors shunt magnetically-coupled RFI from an input coil of the SQUID, and the capacitors shunt electrically-coupled RFI from the SQUID. It should be noted that even though a variety of RC circuits employing conventional resistors and capacitors are described, any form of filter circuit that has similar properties (for example, with respect to cut-off frequency and sharpness) can be used. For example, a filter made up of superconducting striplines that cuts out components of RFI from getting coupled into the shielded SQUID from unshielded gradiometers may be effectively used.

The present invention also contemplates an enclosure for electromagnetically isolating the filter circuit from the SQUID for improved RFI shielding, and a method for improved RFI decoupling from the SQUID that enables an impedance $Z_{C_i}$ between the input coil and the SQUID to be increased without a loss of sensitivity in the apparatus.

This invention allows for widespread usage of SQUID systems in unshielded environments, even in the presence of strong RFI. This opens up the possibility of employing SQUIDs in various biomedical and nondestructive evaluation applications without sacrificing performance. In effect, the invention enables manufacture of a practical sub-picotesla detector.

BRIEF DESCRIPTION OF THE DRAWINGS

A more complete understanding of the invention may be obtained by reading the following description of specific illustrative embodiments of the invention in conjunction with the appended drawing in which.

In the various figures, like reference numerals designate like or similar elements of the invention.

DESCRIPTION OF THE PREFERRED EMBODIMENTS

The present disclosure is to be considered as an exemplification of the principles of the invention and the associated functional specifications for its construction, and is not intended to imply limitations to the invention beyond those that are specifically claimed. Those skilled in the art may envision other possible variations beyond those exemplified here that fall within the scope of the present invention as claimed.

Figure 4:
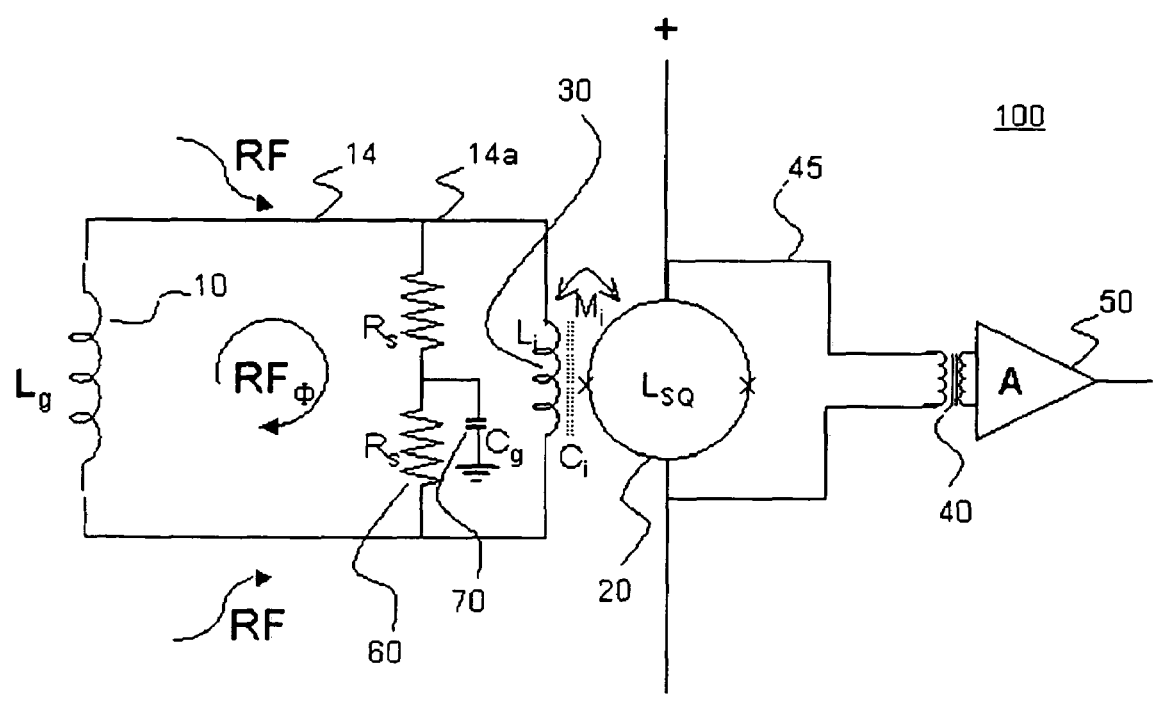
FIG. 4 illustrates a first embodiment of the present invention.

FIG. 4 presents a circuit diagram for a SQUID-based gradiometer constructed according to a first embodiment of the present invention. Conventionally, apparatus 100 includes a gradiometer 10 (represented in FIG. 4 by inductance $L_g$) coupled to a SQUID 20 (with washer inductance $L_{SQ}$) via an input coil 30 (represented by inductance $L_i$ and having a mutual inductance $M_i$ and capacitance $C_i$ with respect to the SQUID washer 20).

RFI may be coupled into SQUID 20, in two ways: electrically and magnetically. For example, with reference to FIG. 4, RFI may couple into the SQUID washer 20 by means of connecting wires (such as transmission lines 14, 14a coupling gradiometer 10 via the input coil and/or connecting wires 45 coupling amplifier 50 via transformer 40 and/or, with reference to FIG. 3, transmission lines 15 coupling RFI via the feedback/modulation coil 33) acting like electromagnetic antennae. RFI can also be coupled into the SQUID washer 20 via magnetic flux threading various loops formed by the transmission lines 14, 14a and 45. In addition, under some circumstances, RFI may produce a large DC field on the SQUID washer 20. Since SQUIDs are very low impedance devices, they are generally most affected by magnetically-coupled RFI. Electrically-coupled RFI may however also be substantial, especially near and above FM radio band frequencies, at which point SQUID connecting wires can function as transmission lines.

Fundamentally, RFI and other forms of electromagnetic interference (EMI) may get coupled into a SQUID via any electronic connections. As has been understood, RFI may be reduced or eliminated by employing symmetric electronics that allow one to remove a ground connection to SQUID. The symmetry of the electronics enables transmitted RF energy that is coupled into the SQUID to be reduced. For example, with reference to FIG. 3, RFI picked up through transmission line 15, including residual energy that may be coupled through the feedback/modulation coil 33 and the rest of the electrical connections to SQUID washer 20, may be eliminated in accordance with the principles of the present invention by using special symmetric filter circuits.

Figure 1:
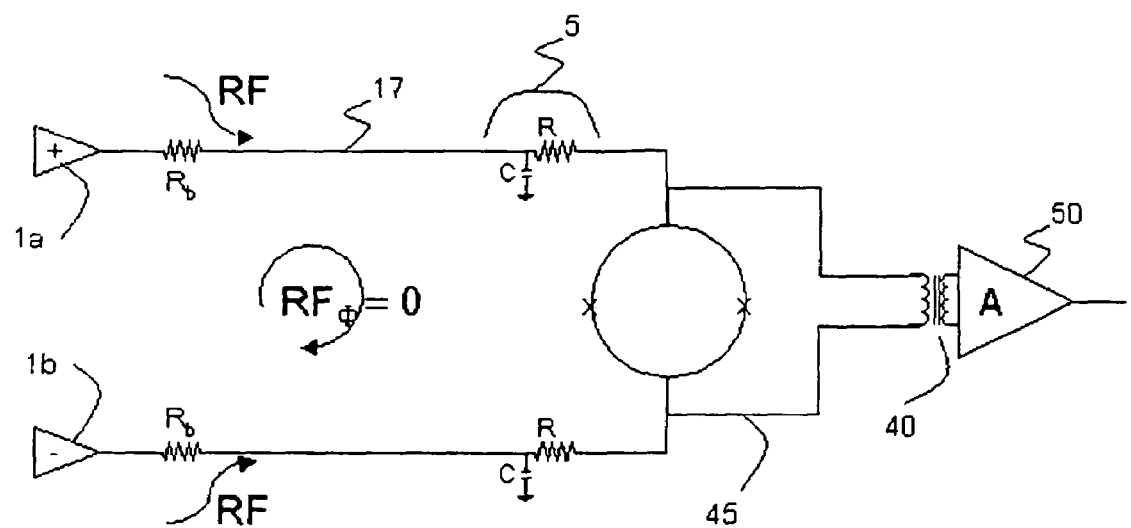
FIG. 1 illustrates a schematic of symmetric SQUID bias electronics, wherein the twisted wire pairs (twisting is not shown) prevent flux from threading the loop.
Figure 2:
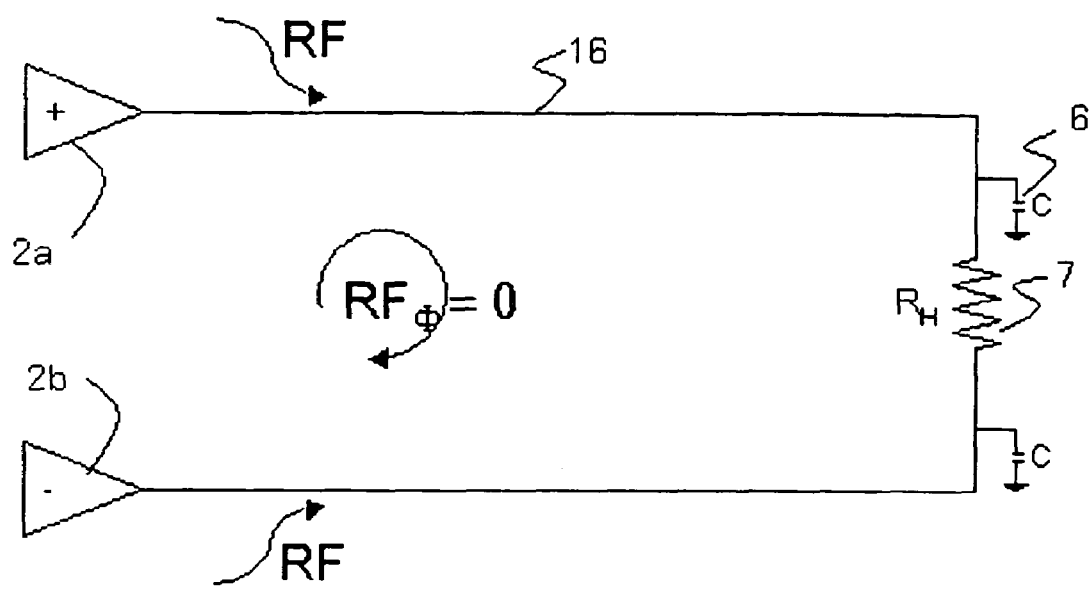
FIG. 2 illustrates a schematic of symmetric SQUID heater electronics, wherein the twisted wire pairs (twisting is not shown) prevent flux from threading the loop.

Symmetric SQUID electronics eliminate ground loop issues. FIGS. 1 and 2 show the symmetric SQUID bias and heater electronics, respectively. In FIG. 2, heating occurs in resistor 7 (depicted as $R_H$). Symmetry ensures that if connecting wires act as antennae, RFI voltages induced on them may be canceled out at the location of the SQUID.

Figure 3:
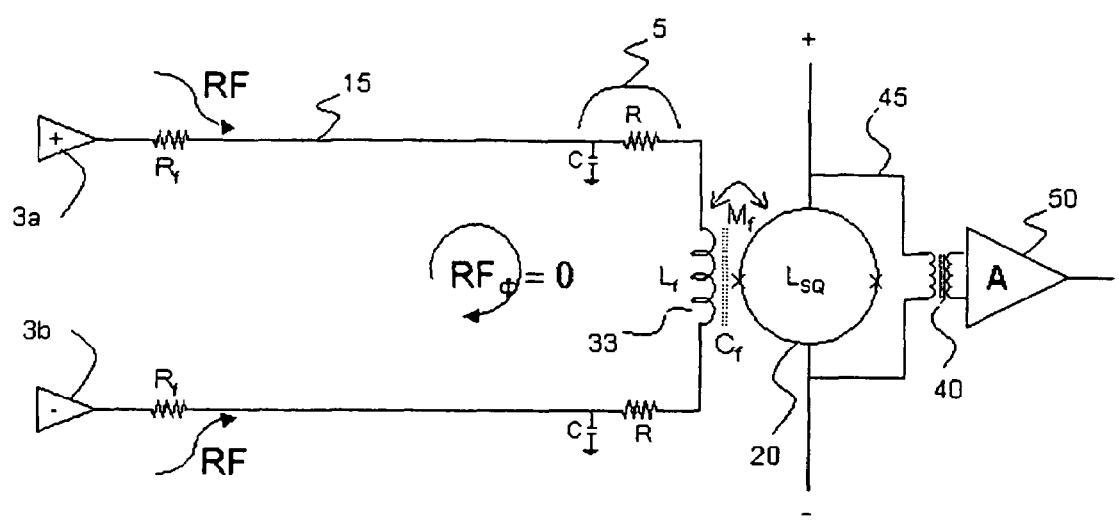
FIG. 3 illustrates a schematic of a feedback/modulation coil as coupled to a SQUID.

As illustrated for example by FIGS. 1-3, symmetric signal sources 1, 2 and 3 place signals onto transmission lines 17, 16 and 15. While doing so, RFI and other ambient noise also gets transmitted via the wires 15-17. This induces RF electric fields on transmission lines 15-17, and magnetic flux $\Phi$ and magnetically-coupled interference $RF_{101}$ in the loops formed by these transmission lines 15-17.

As illustrated in FIGS. 1 and 3, symmetrical RC filters 5 ($f_c$~1-10 megahertz) and capacitors 6 prevent standing waves from being set up at resonant frequencies: (a) on transmission lines 15-17 and 45 at near 10-100 s of megahertz, and (b) between SQUID washer 20 and either the input coil 30 and/or the feedback/modulation coil 33 at a few gigahertz. Additionally, if transmission lines 15-17 and 45 are configured as tightly twisted wire pairs, virtually no magnetic flux $\Phi$ threads the associated circuit loops. Circuit symmetry ensures, for example, that if the transmission lines 17 of FIG. 1 act as antennae, the RFI voltage induced on them cancels out at the SQUID washer 20.

FIG. 3 illustrates feedback/modulation coil 33, which shares SQUID feedback and modulation circuitry. Magnetic interference through the loop is eliminated by tightly twisted wire pairs forming transmission lines 15 (so that $\Phi$ is effectively 0). It should be noted that an antenna-like pick up of RFI can still be coupled to the SQUID through capacitive coupling between the feedback coil 33 and the SQUID washer 20. Capacitance $C_f$ of the modulation coil 33 may typically be about 10 picofarads (pF). The modulation signal has components up to 1 megahertz (MHz). Thus, an RC filter 5 is chosen such that it has an effective bandwidth greater than 10 MHz, and a capacitance C large enough (compared to $C_f$) to short most of the RFI from the SQUID washer 20. Representative values for RC filter 5 are R=100 ohms ($\Omega$) and C=1 nanofarads (nF).

FIG. 4 illustrates a first embodiment of the present invention as a component of measuring apparatus 100. RC filter 5 (also illustrated in FIG. 3) can be used to cut down the antenna-coupled RFI, but gradiometer 10 also introduces magnetic flux threading loop formed by transmission lines 14. As a result, to eliminate both the antenna coupled RFI and magnetic flux $RF_{101}$, the invention of FIG. 4 couples resistive shunts 60 to grounding capacitor 70 in order to short out this magnetic flux from component loop 14a and input coil 30. Alternatively, a single resistive shunt 60 may be coupled with symmetrical RC filters 5 as shown for measuring apparatus 200 in FIG. 5.

In order to better understand how the present invention works, parameters suitable for a working system are illustrated below. It should be noted that these specific examples are provided for illustrative and descriptive purposes only, and therefore should not be inferred to limit the scope of the invention as claimed.

The impedance values at various operating frequencies are tabulated in Table 1 for the circuit 100 of FIG. 4. The values of various parameters are: Ci=140 pF (measured), Li=300 nanohenries (nH), Cg=10000 nF, $R_s$=1.5′ $\Omega$.

TABLE 1

Impedance calculations for embodiment in FIG. 4.

| F (MHz) | $Z_{Ci}$ | $Z_{Li}$ | $2*R_S$ | $Z_{Cg}$ | $Z_{Cg} + R_S$ | ~$dZ_{Ci}$ | ~$dZ_{Li}$ |
|---|---|---|---|---|---|---|---|
| 1 | 113 $\Omega$ | 1.8 | 3 | 16 m$\Omega$ | 1.5 | | |
| 5 | 22.6 | 9 | 3 | 3.2 | 1.5 | | |
| 100 | 1.13 | 180 | 3 | 0.16 | 1.5 | 11.3 | 18 |
| 500 | 0.226 | 900 | 3 | 0.032 | 1.5 | 11.3 | 18 |

Figure 5:
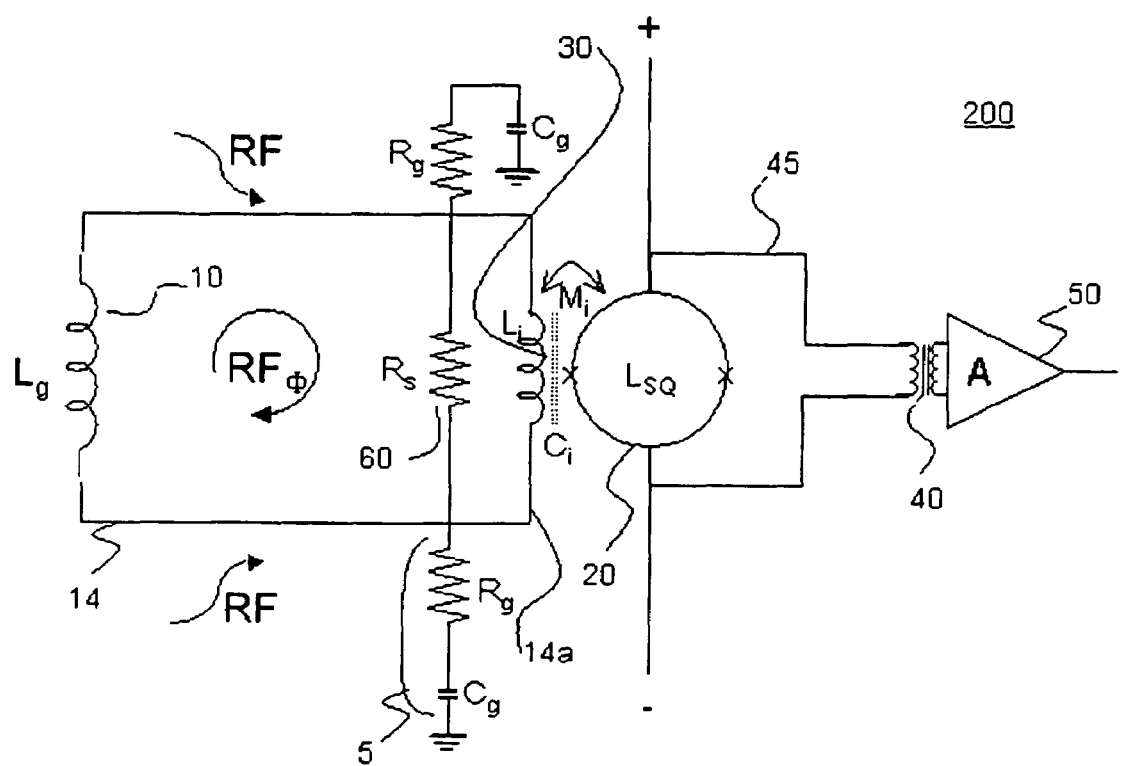
FIG. 5 illustrates a second embodiment of the present invention.

Impedance values for the circuit 200 of FIG. 5 are provided in FIG. 2. All values are the same as in table 1, except $R_S$=3′ $\Omega$ and $R_G$=1.5′ $\Omega$. The circuit FIG. 5 is therefore essentially equivalent to the circuit 100 of FIG. 4.

TABLE 2

Impedance calculations for embodiment in FIG. 5.

| F (MHz) | $Z_{Ci}$ | $Z_{Li}$ | $R_s$ | $Z_{Cg}$ | $Z_{Cg} + R_g$ | ~$dZ_{Ci}$ | ~$dZ_{Li}$ |
|---|---|---|---|---|---|---|---|
| 1 | 113 $\Omega$ | 1.8 | 3 | 16 m$\Omega$ | 1.5 | | |
| 5 | 22.6 | 9 | 3 | 3.2 | 1.5 | | |
| 100 | 1.13 | 180 | 3 | 0.16 | 1.5 | 11.3 | 18 |
| 500 | 0.226 | 900 | 3 | 0.032 | 1.5 | 11.3 | 18 |

Figure 6:
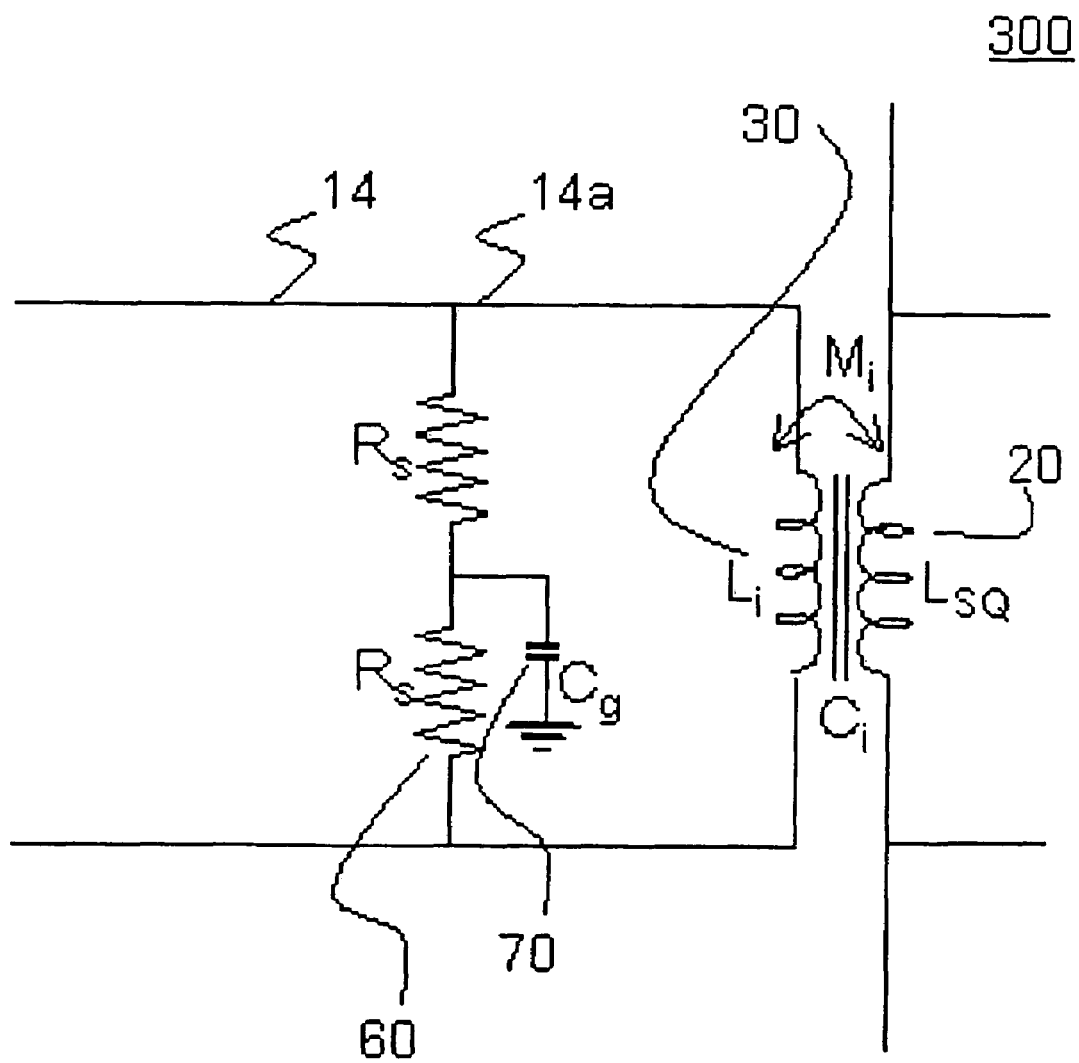
FIG. 6 illustrates an equivalent circuit diagram for the embodiment of FIG. 4 in low frequency instances.

For lower frequencies (i.e., below 5 MHz), the input coil impedance $Z_{Li}$ is low enough and the wavelength of accompanying RFI is long enough for the circuit 100 of FIG. 4 to be represented as the equivalent circuit 300 of FIG. 6. As may be observed from Tables 1 and 2 and FIGS. 4 and 5, the grounding tap capacitor 70 (represented as Cg) is able to effectively shunt out the electrical component of RFI pickup from the SQUID because the capacitive impedance $Z_{Ci}$ between the input coil 30 and the SQUID washer 20 is much greater than $Z_{Cg}+R_S$ (or $Z_{Cg}+R_g$ of Table 2).

Figure 7:
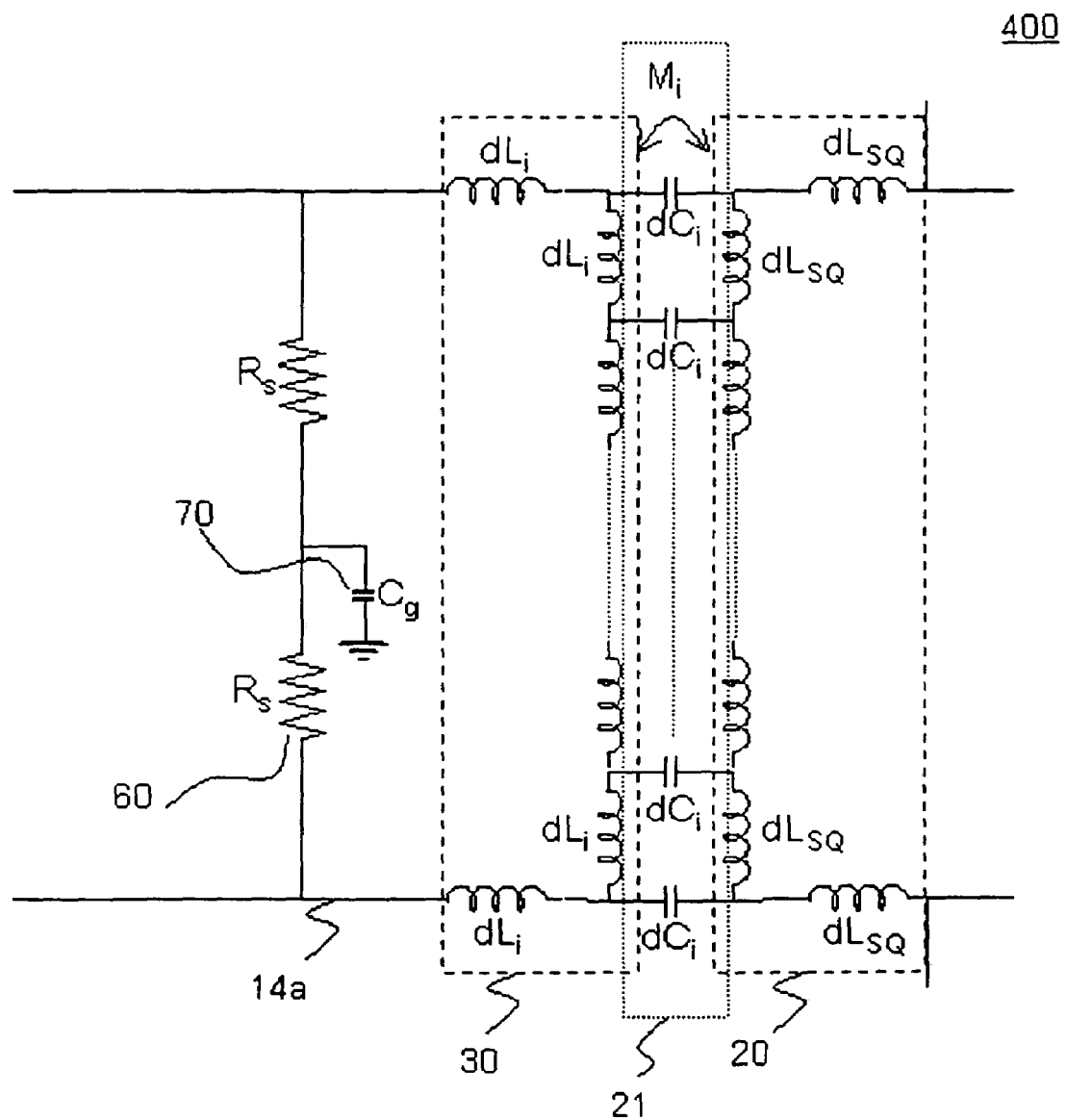
FIG. 7 illustrates an equivalent circuit diagram for the embodiment of FIG. 4 in high frequency instances.

At higher frequencies, the circuit 100 of FIG. 4 behaves in accordance with the equivalent circuit 400 shown in FIG. 7 with distributed L—C circuit elements: the distributed input coil elements 30 and distributed inductive SQUID washer elements 20, coupled via distributed capacitive impedance 21 and mutual inductance 22. Representative approximations for elements $dZ_{Ci}$, $dZ_{Li}$ in this case are tabulated in the last two columns of Tables 1 and 2. These approximations are estimated by considering that once the partial inductive impedance of a certain length of the feedback coil 30 (where $dZ_{Li}$ is proportional to the length of input coil 30) starts to become larger than the capacitive impedance 21 between the feedback coil 30 and the SQUID washer 20 (where $dZ_{Ci}$ is inversely proportional to the length of input coil 30, because the coil width is fixed for both L and C) over the same length segment, then it can effectively be considered to behave as a distributed LC network. This may occur, for example, with values of about 10-20′ $\Omega$ for $Z_{Li}$ and $Z_{Ci}$. These numbers are still larger than $Z_{Cg}+R_S$ (or $Z_{Cg}+R_g$ for Table 2) at those frequencies by a factor of approximately 10, so that shunting by RC circuit 60, 70 is still effective. At frequencies in excess of 1 GHz, the system 30-21-22-20 of FIG. 7 behaves as a transverse magnetic (TM) mode resonator coupled to a well-damped (with $R_S$ or Rg) input loop circuit, thus still avoiding instability of operation.

As illustrated for example by FIG. 4, the shunt resistors 60 effectively remove the RF magnetic flux threading the input loop defined by transmission line 14a from affecting the SQUID by shorting the gradiometer loop defined by transmission line 14. $Z_{Li}$ is much greater than $R_S$ for frequencies higher than about 5 MHz (for example, as shown in Tables 1 and 2). For lower frequencies, shunting resistors $R_S$ still help by shunting part of the RF flux away from SQUID washer 20. In principle, this effect may be further improved by reducing the value of the $R_S$. Unfortunately, there is a trade-off between smaller $R_s$ and the flux noise it adds into the SQUID (from Johnson current noise coupled through the input coil 30 according to the following relationship:

$$\Rightarrow (i_n)=\sqrt{4k_BT/R} \Rightarrow (\Phi_n)=M_i(i_n) \qquad (2)$$

where $k_B$ is the Boltzmann constant and T is the temperature of the resistor R, $i_n$ is the Johnson current noise and $\Phi_n$ is the flux noise induced in the SQUID.

Therefore, we can conclude that for the apparatuses 100, 200 of FIGS. 4 and 5, the optimum value for $R_S$ is 3´ Ω (2* $R_S$ in Table 1 or $R_S$ in Table 2). It should be noted that this optimum value may vary based upon other parameters associated with the circuitry of the system of the present invention.

In light of the preceding discussion, it is clear that it could prove very difficult to eliminate magnetically coupled low frequency RFI (below 5 MHz). In this case, we would like to point out that we could be better served by using a conventional SQUID flux-locked loop (FLL) at 5 MHz or higher (for example, see the book by H. Weinstock entitled, "Applications of Superconductivity," Kluwer, Netherlands, 2000). In this case, the troublesome low frequency RFI can be nulled by the FLL as it would now be fast enough to track the RFI in this frequency range. Another advantage that will be gained from increasing FLL frequency is that the slew rate will also be faster, and thus more immune to fast switching noise from nearby major power sources and electric lightening in the atmosphere.

Figure 9:
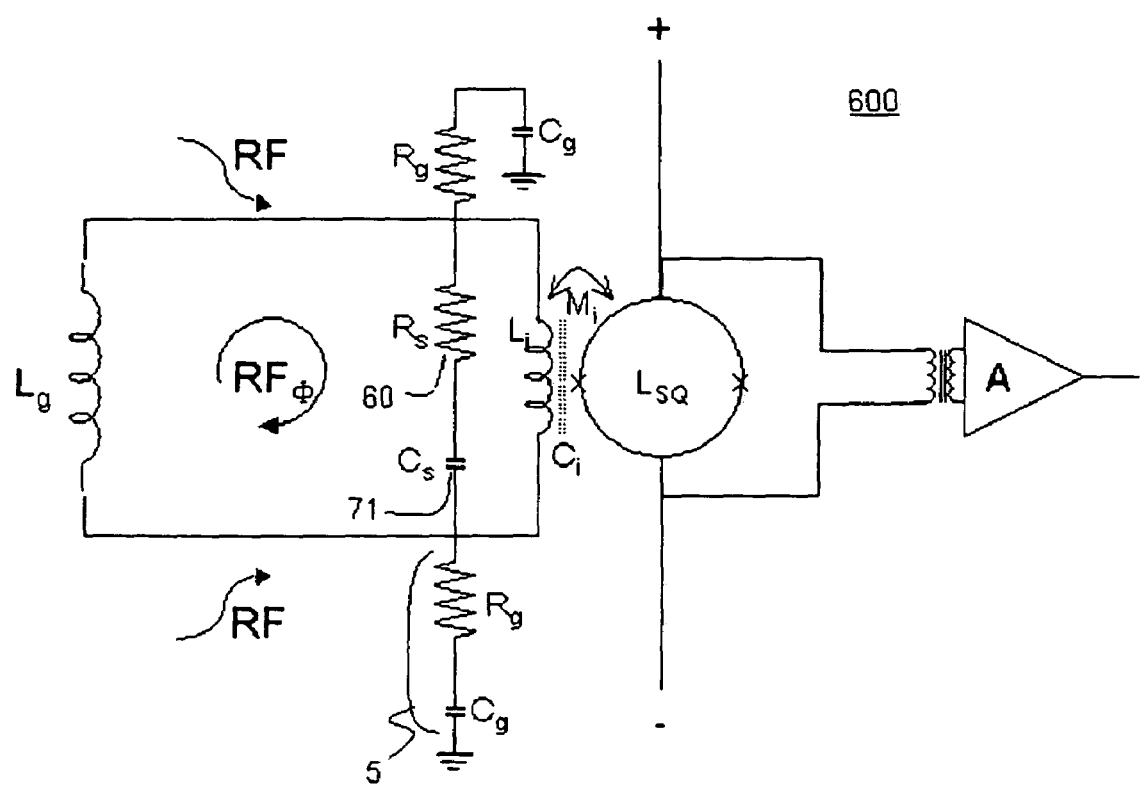
FIG. 9 illustrates a first variation of the embodiment of FIG. 5.
Figure 10:
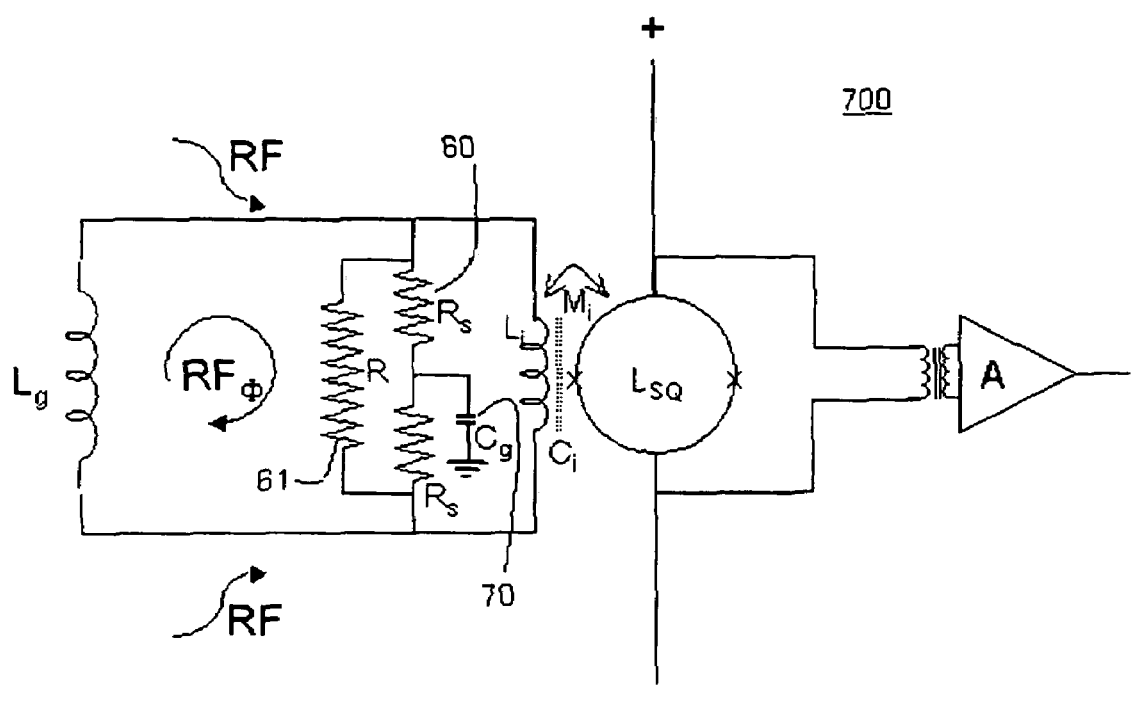
FIG. 10 illustrates a second variation of the embodiment of FIG. 4.

Additional variations on the inventive embodiments of FIGS. 4, 5 include featuring a shunt capacitors 71 (represented by $C_S$) in series with the shunt resistors 60 (see, e.g., circuits 500 and 600 of FIGS. 8 and 9), and featuring an additional shunt resistor 61 (represented by R) in parallel with the circuit defined by shunt resistors 60 and grounding capacitor 70 (see, e.g., circuit 700 of FIG. 10). The shunt capacitor 71 is chosen such that it forms a high pass circuit (with $R_S$ and $L_i$) that blocks low frequency flux noise $RF_\Phi$ from getting to the SQUID washer 20. Introduction of $C_S$ however may, in some cases, cause instability of SQUID operation. This problem can be avoided by circuit 700 of FIG. 10, where parallel circuit shunt resistor 61 can be made to have a very small resistance. This helps to reduce RFI at frequencies lower than 5 MHz.

Figure 8:
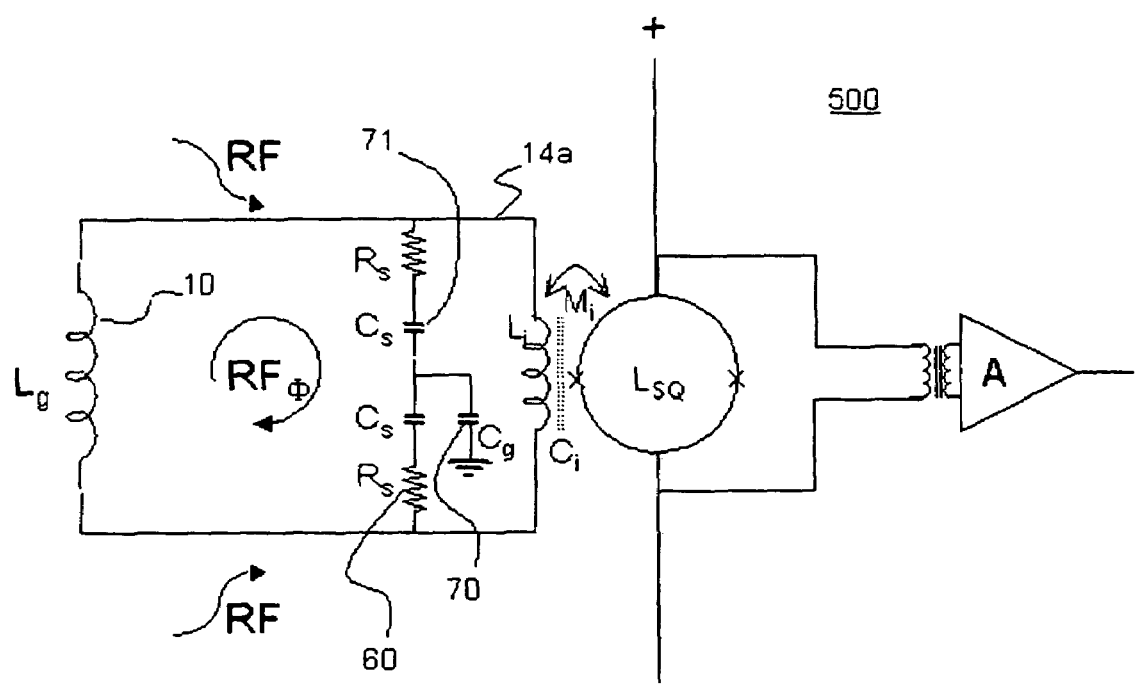
FIG. 8 illustrates a first variation of the embodiment of FIG. 4.

The embodiments illustrated in FIGS. 4 and 10 are simple and compact, and thereby more resistant to parasitic effects than the embodiments illustrated in FIGS. 5, 8 and 9. On the other hand, the embodiment illustrated in FIG. 5 has the advantage that $R_g$ can be made much smaller, thus making $Z_{Cg}+R_g$ much smaller than $Z_{Ci}$. This approach will improve the RF voltage filtering without introducing additional flux noise into the SQUID because of the symmetry of the circuit 200. Also, as illustrated by the circuit 600 in FIG. 9, $R_S$ can be lowered independently for filtering RF magnetic pickup, and only one additional shunt capacitor 71 needs to be added. In the circuit 500 of FIG. 8, $R_S$ can be reduced, thus making $Z_{Cg}+R_S$ much smaller than $Z_{Ci}$, and thereby enabling RF voltage filtering to improve. But, in this case, two additional shunt capacitors 71 are required.

While only a few specific resistive and capacitive filters are illustrated in the present description, one skilled in the art will readily recognize that any other form of filter circuit that has similar properties (cut-off frequency and sharpness of characteristics and elimination of both the electric and magnetic components of the interference) may be used. As an example, one embodiment could include a superconducting filter made up of superconducting striplines that cuts out all components of RFI from getting coupled into the shielded SQUID from unshielded gradiometers.

Tables 1 and 2 suggest that if the SQUID is redesigned such that the capacitance between the input coil 30 and the SQUID washer 20 (represented by $C_i$) is reduced, then $Z_{Ci}$ will become larger. This increased impedance makes the SQUID 20 more immune to electrical components of RFI.

Figure 11:
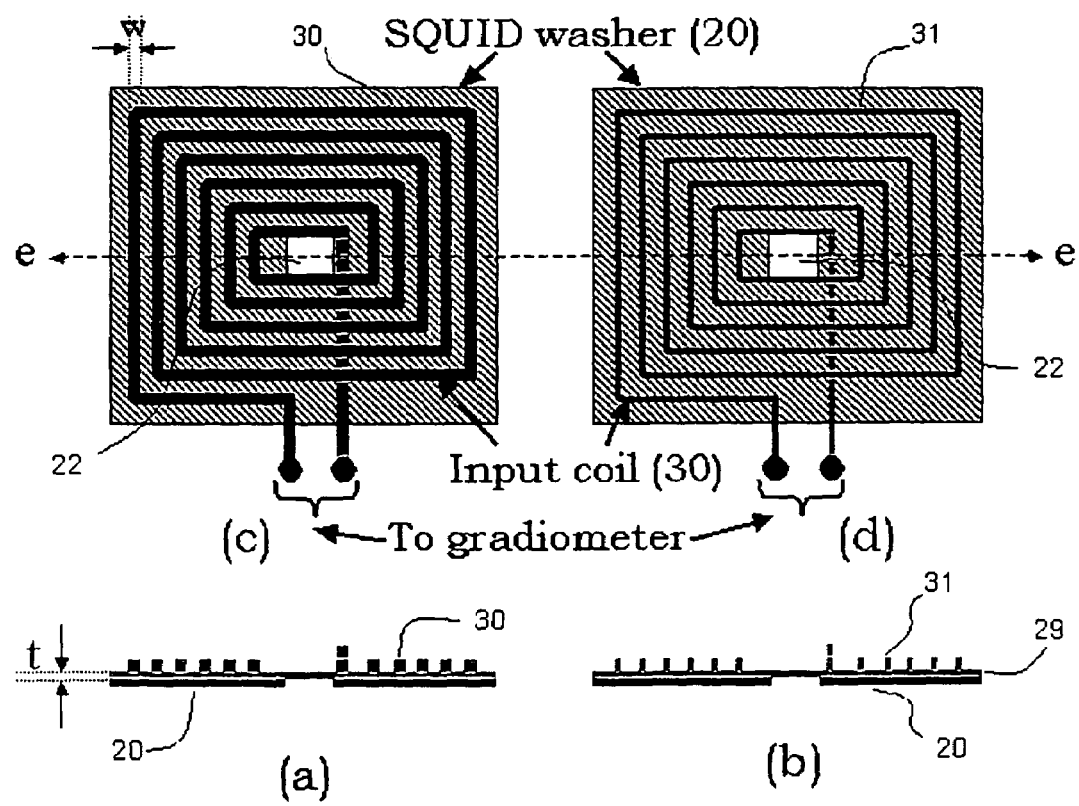
FIGS. 11(a)-11(d) illustrate a SQUID design according to principles of the present invention that enables reduction of RFI coupling into the SQUID. A conventional design is shown in FIGS. 11(a) and 11(c), and the inventive design is shown in FIGS. 11(b) and 11(d))

FIGS. 11(a)-11(d) shows a SQUID including SQUID washer 20 and spiral input coils 30, 31. Coils 30, 31 are separated from the SQUID washer 20 by an insulator 29 providing a separation of thickness t. Only N=5 turns of the input coils 30, 31 are shown for clarity, but in practical designs N may approach 100 (for a detailed discussion, including inductance calculations and formulae that follow, please refer to Chapters 1 and 2 in the book by H. Weinstock entitled, "Applications of Superconductivity" Kluwer, Netherlands, 2000). FIGS. 11(c) and 11(d) show a top view of the SQUID, and FIGS. 11(a) and 11(b) show a cross-sectional view taken through the dashed line "e-e". Reducing the line width, w, of the input coil 31 as compared to input coil 30 will decrease the capacitance in that proportion as $C \propto N \cdot w/t$ (compare FIG. 11c with 11d).

The mutual inductance between the input coil 30, 31 and the SQUID washer 20, Mi, is given by:

$$M_i \approx N \cdot L_{SQ} \qquad (3)$$

where $L_{SQ}$ is the inductance of the SQUID washer. Accordingly, Mi is unchanged by reduction in line width w. The input coil inductance, Li, is given by:

$$L_i = N^2 \cdot L_{SQ} + L_{strip} \qquad (4)$$

where $L_{strip}$ is the stripline inductance of the lines that make up the input coil 30. Although, $$L_{strip} \approx \mu_0 \cdot \frac{t}{w+2t}$$

increases as w is decreased, for sufficiently large N (for nominal SQUID design this corresponds to N greater than 20), $L_{strip}$ can be ignored and $L_i \approx N^2 \cdot L_{SQ}$. Here $\mu_0$ is the permittivity of the free space. Thus, for practical designs, Li is also independent of w.

Thus, in summary, the reduction in line width of the input coil lines (as illustrated by input coil 30 and input coil 31 in FIGS. 11(c) and 11(d)) results in a decrease in $C_i$, but as Mi and Li are unchanged, does not lead to any loss of sensitivity $$S \propto \frac{M_i \cdot \phi}{L_i + L_g}$$

(here $L_g$ is the gradiometer inductance and is independent of the SQUID design). The decrease in $C_i$ leads to increase in $Z_{Ci}$ making it that much larger than $Z_{Cg}$, and this in turn further reduces the electrical RFI into the SQUID washer 20 (please refer to Tables 1 and 2 and FIGS. 6 and 7).

RF currents flowing through the filter circuit wires could also get coupled into the SQUID if the filter wires are close to the SQUID washer 20. To prevent this (see, e.g., FIGS. 12(a)-12(c)), a SQUID shield 90 including two electromagnetically isolated chambers 91, 92 may be used to separately house the SQUID 91a (shown in chamber 91) and the filter circuits 92a (shown in chamber 92). Prior art SQUID shields have only one chamber. The use of additional chamber, even though it adds complexity to the manufacturing process, is required to achieve the level of RF immunity needed for unshielded operation of the SQUID instrument.

Figure 12:
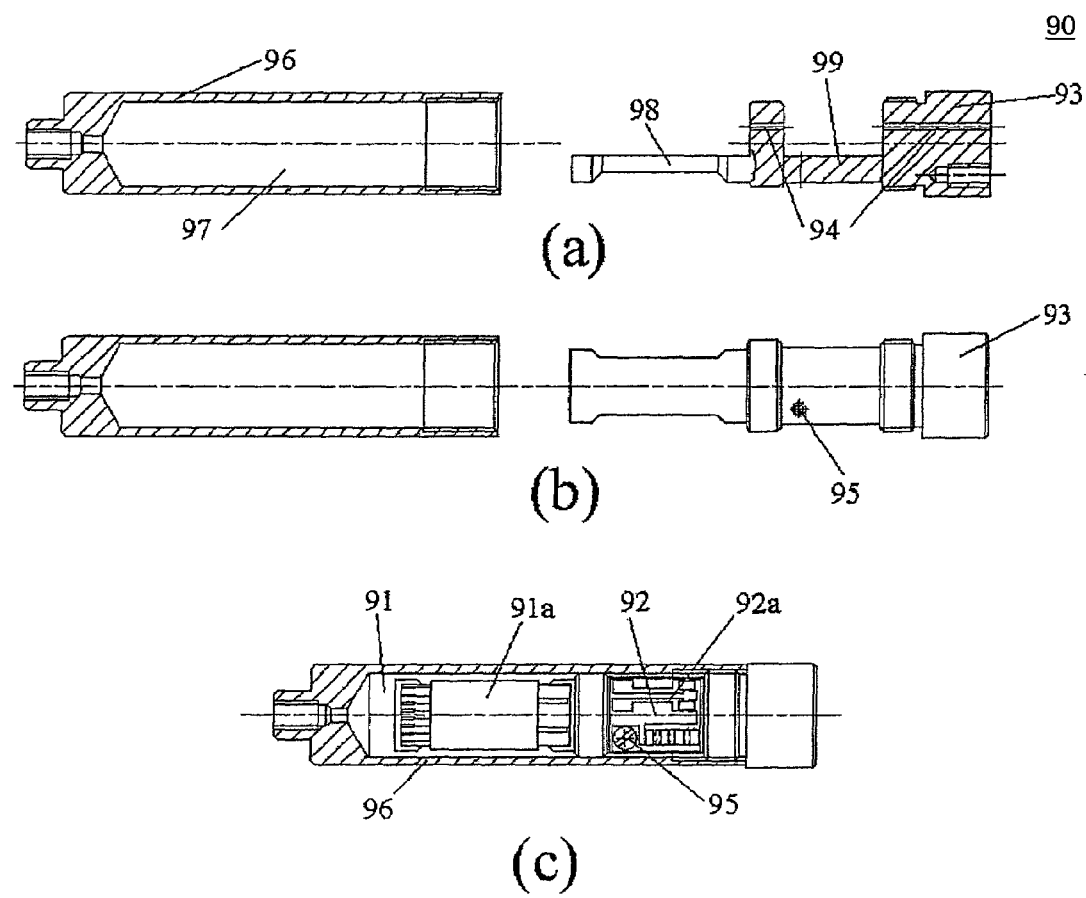
FIG. 12 illustrates a niobium shield designed for holding the SQUID in a chamber which is electromagnetically isolated from the filter circuits of FIGS. 4-10.

FIGS. 12(a)-12(c) illustrate an exemplary SQUID shield 90 including an outer housing 96 with a bore 97 for receiving an insert 93 having relieved portions 98, 99. When insert 93 is inserted into bore 97, each of relieved portions 98, 99 fits sealably within bore 97 to respectively define electromagnetically sealed chambers 91, 92.

A second bore 94 (for example, less than a tenth of the diameter of the shield) in insert 93 allows passage of electrical wires to connect between the SQUID 91a in chamber 91 with the filter circuit 92a in chamber 92 without any electromagnetic leakage. A ground connection 95 is provided for the filter circuit 92a in chamber 92 so ground loop currents are now shielded from the SQUID. This isolation, in addition to the symmetric electronics, fully eliminates any grounding issues in the apparatus.

In summary, a system and method are disclosed for effective implementation of a practical sub-pico Tesla magnetic field detector that is insensitive to RFI. While various embodiments have been shown and described, it will be understood that there is no intent to limit the invention by such disclosure, but rather, it is intended to cover many modifications and alternate constructions falling within the spirit and the scope of the invention, as defined in the appended claims. For example, the present invention should not be limited by specific hardware or type of filter circuit. Thus, one skilled in the art can envision using other formns of filter circuits (just as an example, a filter made up of superconducting striplines) having similar properties (for example, cut-off frequency and sharpness of characteristics).

We claim:

1. In an apparatus for measuring a magnetic field comprising a superconducting quantum interference device (SQUID) inductively coupled to a gradiometer, a device for shielding the SQUID from radio frequency interference (RFI) picked up through the gradiometer, the device including:
   a filter circuit having a resistor-capacitor (RC) combination interconnected to first and second terminals so that the filter circuit is electrically parallel to both an input coil of the SQUID and the gradiometer, wherein the filter circuit is effective to shunt both magnetically-induced and electrically-induced components of RFI generated in the gradiometer away from the input coil, and wherein the filter circuit includes one or more capacitors connected to a system ground.

2. The apparatus of claim 1, wherein the filter circuit includes:
   a first shunt resistor $R_s$ connected between the first terminal and a third terminal;
   a second shunt resistor $R_s$ connected between the second terminal and the third terminal; and
   a grounding capacitor $C_g$ connected between the third terminal and system ground.

3. The apparatus of claim 1, wherein the filter circuit includes:
   a first shunt resistor $R_s$ connected between the first terminal and the second terminal;
   a first series grounding circuit including a first grounding resistor $R_g$ and a first grounding capacitor $C_g$ connected between the first terminal and the system ground; and
   a second series grounding circuit including a second grounding resistor $R_g$ and a second grounding capacitor $C_g$ connected between the second terminal and system ground.

4. The apparatus of claim 1, wherein the filter circuit includes:
   a first series shunting circuit including a first shunting resistor $R_s$ and a first shunting capacitor $C_s$ connected between the first terminal and a third terminal;
   a second series shunting circuit including a second shunting resistor $R_s$ and a second shunting capacitor $C_s$ connected between the third terminal and the second terminal; and
   a grounding capacitor $C_g$ connected between the third terminal and the system ground.

5. The apparatus of claim 1, wherein the filter circuit includes:
   a first series shunting circuit including a first shunting resistor $R_s$ and a first shunting capacitor $C_s$ connected between the first terminal and the second terminal;
   a first series grounding circuit including a first grounding resistor $R_g$ and a first grounding capacitor $C_g$ connected between the first terminal and the system ground; and
   a second series grounding circuit including a second grounding resistor $R_g$ and a second grounding capacitor $C_g$ connected between the second terminal and the system ground.

6. The apparatus of claim 1, wherein the filter circuit includes:
   a first shunt resistor $R_s$ connected between the first terminal and a third terminal;
   a second shunt resistor $R_s$ connected between the second terminal and the third terminal;
   a third shunt resistor R connected between the first terminal and the second terminal; and
   a grounding capacitor $C_g$ connected between the third terminal and the system ground.

7. The apparatus of claim 1, further including a shield for housing the SQUID and the RC circuit so that the RC circuit is electromagnetically isolated from the SQUID.

8. The apparatus of claim 7, wherein the shield comprises two electromagnetically isolated chambers each for housing one of the SQUID and the RC circuit, wherein the two electromagnetically isolated chambers are interconnected by a third chamber having a diameter d.

9. The apparatus of claim 8, wherein the one electromagnetically isolated chamber for housing the RC circuit includes a grounding terminal.

* * * * *

UNITED STATES PATENT AND TRADEMARK OFFICE
CERTIFICATE OF CORRECTION

PATENT NO.         : 7,365,534 B2
APPLICATION NO. : 10/500950
DATED              : April 29, 2008
INVENTOR(S)        : Nilesh Tralshawala et al.

It is certified that error appears in the above-identified patent and that said Letters Patent is hereby corrected as shown below:

On the Title Page Item (75) Inventors: "...Yuri Polyako, East Setauket, NY (US) ..." should be changed to -- ...Yuri Polyakov, East Setauket, NY (US)... --

Signed and Sealed this

Nineteenth Day of August, 2008

JON W. DUDAS
*Director of the United States Patent and Trademark Office*